(12) United States Patent
Bristol et al.

(10) Patent No.: US 7,153,615 B2
(45) Date of Patent: Dec. 26, 2006

(54) EXTREME ULTRAVIOLET PELLICLE USING A THIN FILM AND SUPPORTIVE MESH

(75) Inventors: Robert Bristol, Portland, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 580 days.

(21) Appl. No.: 10/645,877

(22) Filed: Aug. 20, 2003

(65) Prior Publication Data

US 2005/0042153 A1 Feb. 24, 2005

(51) Int. Cl.
 *G03F 1/00* (2006.01)
(52) U.S. Cl. .......................................................... 430/5
(58) Field of Classification Search .................... 430/5, 430/394; 378/35; 428/14
 See application file for complete search history.

(56) References Cited

U.S. PATENT DOCUMENTS

| 6,731,378 B1 * | 5/2004 | Hibbs ........................... 355/75 |
| 6,835,508 B1 * | 12/2004 | Butschke et al. .............. 430/5 |
| 7,027,226 B1 * | 4/2006 | Goldberg et al. ........... 359/587 |

OTHER PUBLICATIONS

Werner A. Goedel, "From Monolayers of a Tethered Polymer Melt to Freely Suspended Elastic Membranes", 1998 American Chemical Society, Chapter 2, pp. 10-30.

* cited by examiner

*Primary Examiner*—S. Rosasco
(74) *Attorney, Agent, or Firm*—Fish & Richardson P.C.

(57) ABSTRACT

An extreme ultraviolet (EUV) pellicle including a thin film or membrane and a supportive wire mesh. The pellicle allows EUV radiation to pass through the pellicle to a reticle but prevents particles from passing through the pellicle. A buffer gas supports the film against the wire mesh. The film or membrane may be embedded with support fibers or beams.

20 Claims, 5 Drawing Sheets

EXTREME ULTRAVIOLET PELLICLE USING A THIN FILM AND SUPPORTIVE MESH

BACKGROUND

A microchip manufacturing process may deposit various material layers on a wafer and form a photosensitive film or photoresist on the deposited layers. The process may use lithography to transmit light through transmissive optics or reflect light from reflective optics to a reticle or patterned mask. Light from the reticle transfers a patterned image onto the photoresist. A process may remove portions of the photoresist which are exposed to light. A process may etch portions of the wafer which are not protected by the remaining photoresist to form transistor features.

The semiconductor industry continually reduces the size of the smallest transistor features to increase transistor density and to improve transistor performance. This desire has driven a reduction in the wavelength of light used in photolithographic techniques to define smaller transistor features in a photoresist.

DETAILED DESCRIPTION

Extreme Ultraviolet lithography (EUVL) may use a wavelength of approximately 11–15 nanometers (nm) in some embodiments and other wavelengths in other embodiments. An EUV lithography tool may print a pattern on a photoresist with dimensions which are smaller than dimensions achieved by other lithography tools. An EUV "lithography tool" may also be called a "lithographic exposure system," "EUV scanner" or "EUV stepper."

Figure 1A:
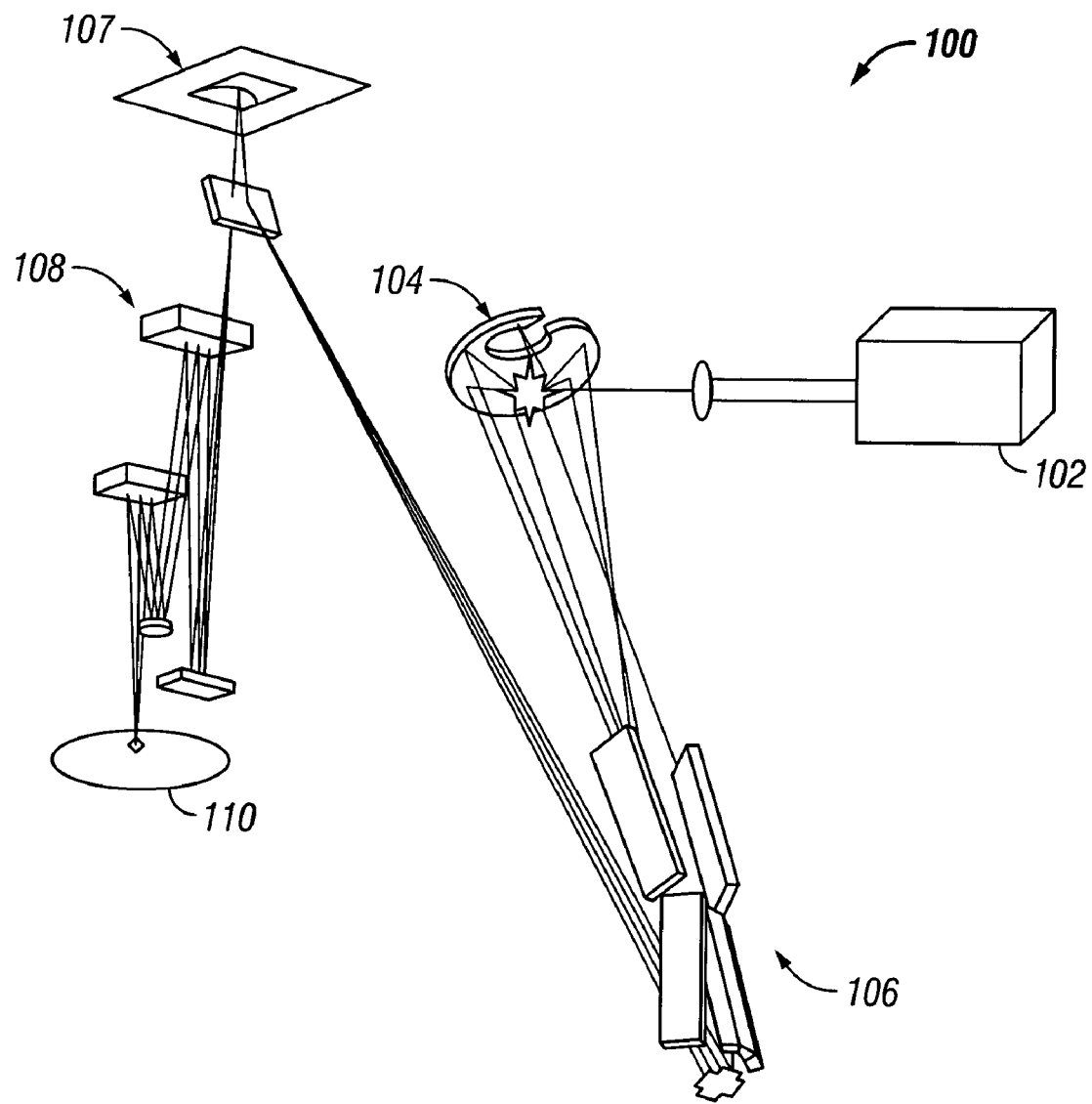
FIG. 1A illustrates an example of an Extreme Ultraviolet (EUV) lithography tool.

FIG. 1A illustrates an example of an Extreme Ultraviolet (EUV) lithography tool 100. The lithography tool 100 may include a laser 102, an electric discharge or laser produced plasma source 104, a plurality of condenser optics 106, a reflective reticle 107 with a pattern, and a plurality of reflective reduction optics 108. The reticle (also called a mask) 107 may be used to form a patterned image on an object 110.

The reticle 107 may be unprotected from particle debris and contamination caused by EUV radiation. A current strategy uses special handling of the reticle 107 to minimize a chance of particles from falling onto the reticle 107. However, this may be difficult since even one particle falling on an EUV reticle 107 may cause the yield for every die thereafter to fall to zero.

The present application relates to an extreme ultraviolet (EUV) pellicle, which may include a thin film or membrane and a supportive grid or mesh. Embodiments are shown in FIGS. 1B–5.

Figure 1B:
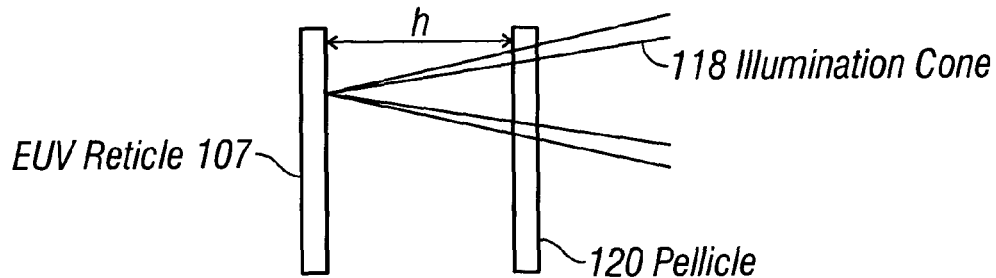
FIG. 1B illustrates an EUV reticle, an illumination cone and a protective pellicle which may be used in the EUV lithography tool of FIG. 1A.

FIG. 1B illustrates an EUV reticle 107 usable in the lithography tool 100 of FIG. 1A. An illumination cone 118 illustrates a cone of radiation. A protective pellicle 120 may be used in the EUV lithography tool 100 to protect the reticle 107 from particle debris and contamination caused by EUV radiation.

Pellicle and reticle dimensions may vary according to a suppliers' design. The reticle 107 may comprise a material such as quartz or some other low thermal expansion material (LTEM). As an example, the reticle 107 may have an area of 152 mm×152 mm in FIG. 1A. The pellicle 120 may have an area of a few inches wide.

Figure 2:
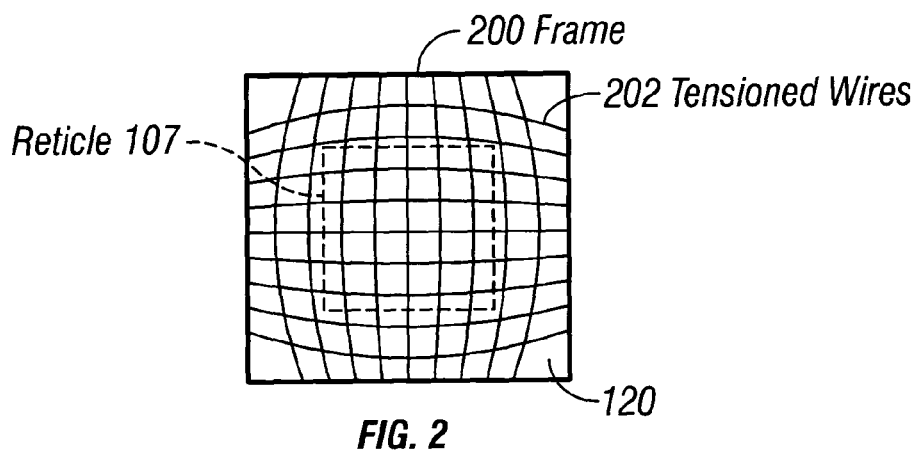
FIG. 2 is a top view of the pellicle of FIG. 1B, a pellicle frame and an underlying reticle.

FIG. 2 is a top view of the pellicle 120 of FIG. 1B, which includes a tensioned wire mesh (also called a wire "grid") 202, and a pellicle frame 200. The frame 200 surrounds and supports the pellicle 120 above the underlying reticle 107. The pellicle 120 and frame 200 may be rectangular, circular, oval or any other desired shape. The pellicle 120 may be attached to a frame 200 via adhesives, bonding or mechanical attachment. The frame 200 may be attached to the reticle 107 via adhesives, bonding or mechanical attachment.

In an application, the pellicle 120, frame 200 and reticle 107 may move in and out of the lithography tool 100. Where the pellicle 120 rides along with the reticle 107 both in and out of the lithography tool 100, the frame 200 may be sufficiently sized to cover at least 6" of the reticle 107.

In another application, the pellicle 120 and wire mesh 202 may be used as a fixed EUV window internal to the lithography tool 100. Such a window may remain fixed with respect to the illumination cone 118 and would serve to protect the reticle 107 against debris produced internally to the lithography tool 100. For an application that uses the pellicle 120 as an EUV window inside the tool 100, the frame 200 may be sized to cover a smaller distance than 6" of the reticle 107.

The wire mesh 202 may be made of metal. The supportive frame 200 may be machined with laser-drilled holes through which the wires of the mesh 202 may be threaded. Alternatively, the wires of the mesh 202 may be directly bonded to the frame 200. The edges of the frame 200 may have one or more spring-loaded tension apparatuses to hold the wire mesh 202.

Integrated circuit (IC) wire bonding processes and techniques may be used to make wires of the mesh 202 with a diameter of about 25 μm and to assemble them. A modified integrated circuit wire bonder may bond the wires of the mesh 202 to the frame 200. Integrated circuit applications routinely handle wires with about 25-micron diameters at high speeds, such as greater than 20,000 connections per hour. To make the wire mesh 202 of FIG. 2, the range of travel to form the wires may be increased.

At a nominal distance of one to ten centimeters (e.g., 40 mm) from the reticle 107 in FIG. 1B, the illumination cone 118 may be about 7 mm wide. A tensioned wire obscuration calculation may be expressed as:

h=pellicle standoff=40 mm
$NA_{illumination} = \sigma NA_{camera} \sim 0.7*0.25 = 0.175 \rightarrow$
$\Theta_{illumination} \sim 10$ degrees
where "NA" is the numerical aperture.

The width of illumination cone 118 at pellicle 120≅h* tan (Θ)=7 mm. For a wire size of 25 μm and a wire spacing of 1 mm, the illumination cone 118 will capture about 7 wires so that the illumination uniformity will not change significantly as the reticle 107 is scanned. There may be a geometrical loss of approximately 2.5% from the mesh 202. There may be a geometrical loss of approximately 5% loss after the light reflects off the reticle 107 and passes again through the mesh 202.

Figure 3:
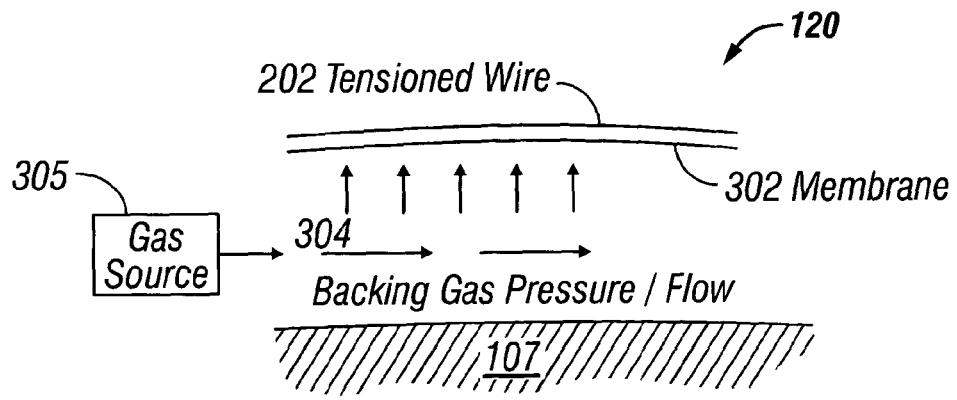
FIG. 3 is a cross-sectional side view of the pellicle and reticle of FIG. 2.

FIG. 3 is a cross-sectional side view of the pellicle 120 and reticle 107 of FIG. 2. The pellicle 120 may include a thin film or membrane 302 adjacent to and underneath a tensioned wire mesh 202. A buffer gas 304 may be supplied between the membrane 302 and the reticle 107. The wire mesh 202 or other means may mechanically support a sub-200-nm thin membrane 302 over a 6" reticle 107. The membrane 302 may be very thin (e.g., 40 nm) and transmit a significant amount of EUV light. Materials for the membrane 302 are described below. The thin membrane 302 may be embedded with a fibrous mesh, as described below with reference to FIGS. 4–5.

The flowing buffer gas 304 may be produced by a gas source 305. The gas 304 may serve one or more functions. First, the gas 304 may physically hold the membrane 302 up against the wire mesh 202 and provide additional pressurized mechanical strength. The gas 304 may have a similar effect to a soda can being stiff before it is opened. Second, the gas 304 may automatically form a repulsive jet through any pinholes in the membrane 302, and thus prevent particles from entering the pinholes. Third, the gas 304 may cool the membrane 302 as it is heated by absorption of the EUV radiation. Fourth, the gas 304 may sweep away any particles that flake off of the reticle-facing side of the pellicle 120.

The choice of buffer gas 304 or gas mixture and pressure/flow may depend on the type and quantity of particles encountered. In addition, the use of a light gas such as Helium would allow some diffusion directly through the membrane 302 (especially if the membrane 302 is a polymer as described below), which yields an outward flow that would repel slow particles from landing on the pellicle 120.

Figure 3A:
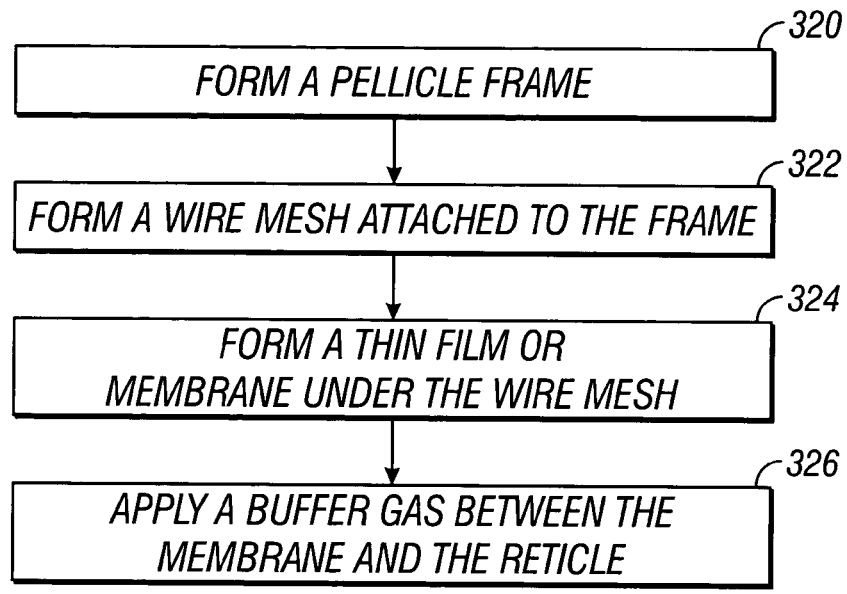
FIG. 3A summarizes a technique for forming the pellicle of FIGS. 2–3.

FIG. 3A summarizes a technique described above for forming the pellicle 120 of FIGS. 2–3. The technique at 320 and 322 forms a frame 202 and forms a wire mesh 202 attached (via threading, bonding or spring-loaded tension apparatus) to the frame 202. At 324, a thin membrane 302 is formed under the wire mesh 202. A buffer gas 304 is applied between the membrane 302 and the reticle 107 at 326.

Figure 4:
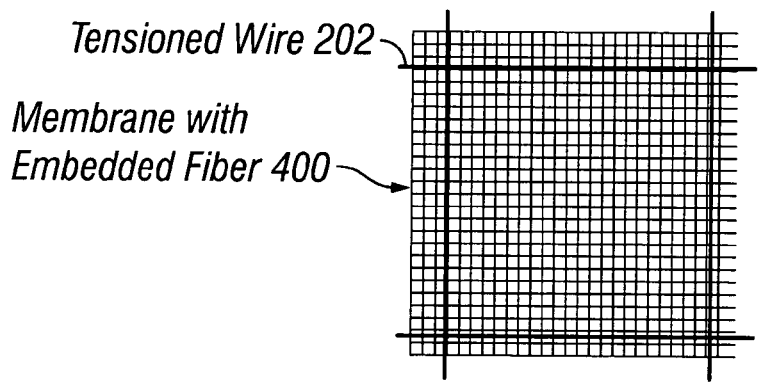
FIG. 4 is an enlarged top view of a section of the wire mesh of FIG. 2 and a membrane which may be used as the pellicle of FIG. 1B.

FIG. 4 is an enlarged top view of a section of the wire mesh 202 of FIG. 2 and a membrane 400 which may be used as the pellicle 120 of FIG. 1B. The membrane 400 spans the tensioned wires 202. In addition to the wire mesh 202, fibers may be embedded in the membrane 400 for additional strength.

Figure 5:
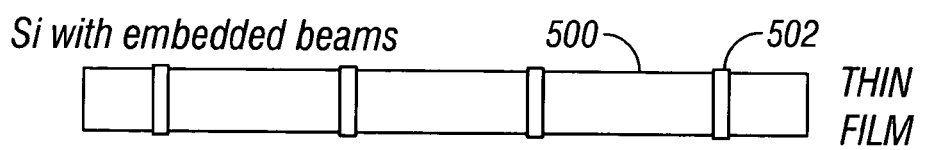
FIG. 5 is a cross-sectional side view of (a) a thin film with embedded support beams and (b) the membrane of FIG. 4 with embedded fibers.
Figure 5:
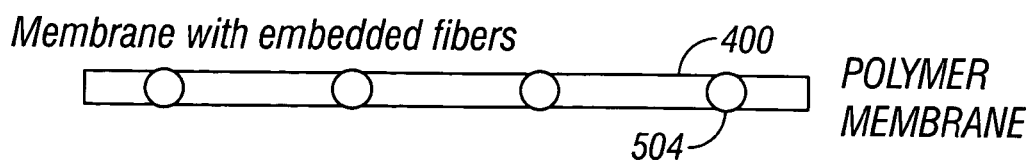

FIG. 5 is a cross-sectional side view of (a) a thin film 500 with embedded support beams 502 and (b) the membrane 400 of FIG. 4 with embedded fibers 504. The film 500 or the membrane 400 in FIG. 5 may be used in the pellicle 107 of FIGS. 1B–3. A first approach (described further below) may use a patterning, deposition, and etch process to create a 70-nm silicon film 500 with an embedded grid of supporting beams 502. A second approach may use a process of curing a polymer-chain thin layer (described further below) to create a 40-nm elastic membrane 400 with embedded fibers 504.

Double-pass illumination through the pellicle 120 occurs due to the reflection off the reticle 107 in FIG. 1B. With double-pass illumination, the 70-nm Si film 500 and 40-nm membrane 400 may each transmit about 80% of EUV illumination.

Uniformity of the thin film 500 and membrane 400 may be excellent due to their fabrication techniques. The Si film 500 may be formed via a well-controlled hetero-epitaxial or chemical vapor deposition process. The membrane 400 may be formed via a self-terminating thin layer explained below.

Figure 6:
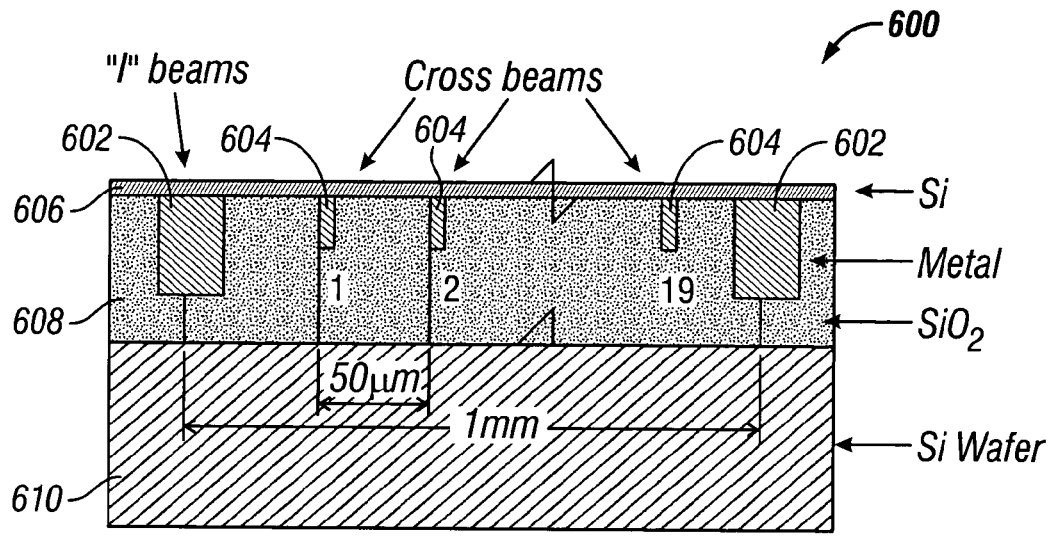
FIG. 6 shows a thin film optionally supported by internal metal wires and small structural supports.
Figure 6A:
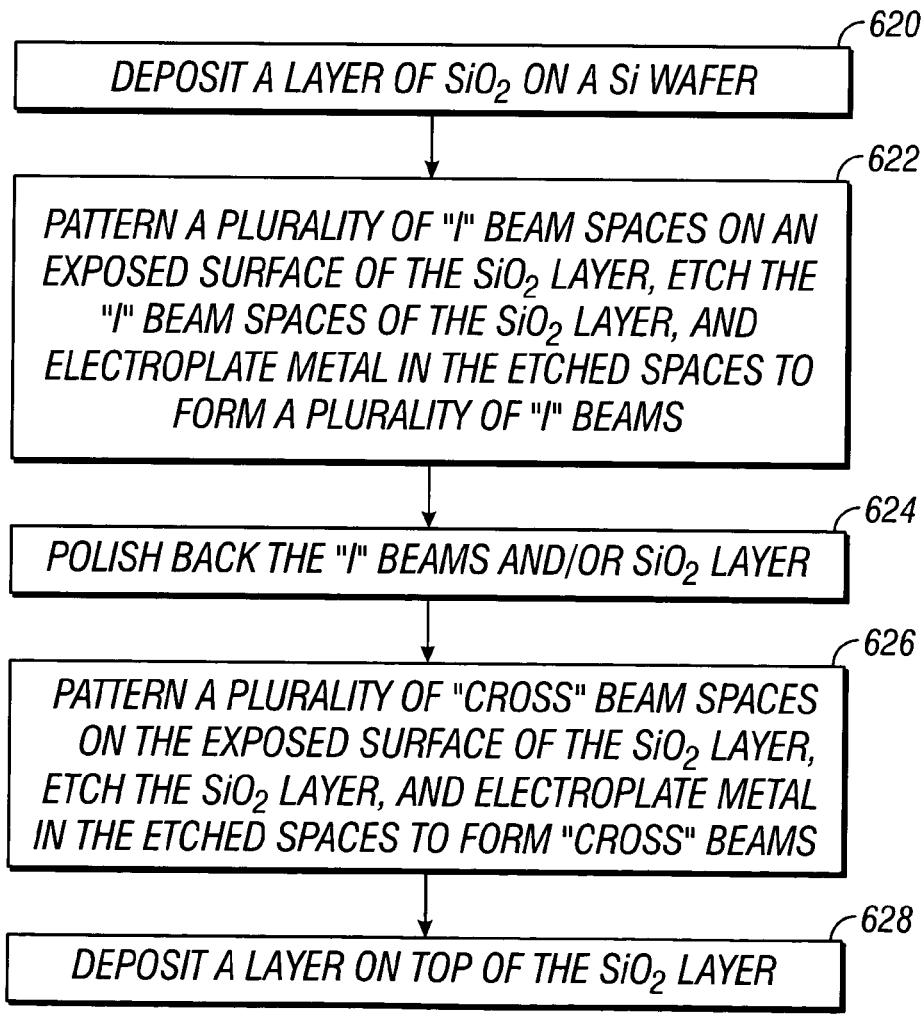
FIG. 6A shows a process flow to make the film of FIG. 6.

FIG. 6 shows a thin film 600 optionally supported by internal/embedded metal wires 602 and small structural supports 604, and FIG. 6A shows a process flow to form the film 600 of FIG. 6. The technique may start with a Si wafer 610. A 35-μm thick layer 608 of $SiO_2$ on the Si wafer 610 is deposited at 620. At 622, a plurality of 25-μm wide "I" beam spaces are patterned on the exposed surface of the $SiO_2$ layer 608, 25-μm deep "I" beam spaces are etched in the $SiO_2$ layer 608, and metal is electroplated to form a plurality of 25-μm deep "I" beams 602. Other depths and widths besides 25 μm may be used, and the "I" beams 602 may be 1 mm apart, as shown in FIG. 6.

The technique at 624 may polish back the "I" beams 602 and/or SiO2 layer 608. If tensioned-wire apparatuses are used, there may not need to be a polish back.

The technique at 626 may further pattern a plurality of 0.5-μm wide "cross" beam spaces on the exposed surface of the $SiO_2$ layer 608, etch 0.5 μm deep in the $SiO_2$ layer 608, and electroplate metal to form 0.5-μm deep "cross" beams 604. The beams 604 may be 50 μm apart as shown. There may be a plurality of "cross" beams 604 (e.g., 19 cross beams 604) between two "I" beams 602.

The "I" beams 602 in FIG. 6 may resemble the tension wire mesh 202 in FIG. 4. The "cross" beams 604 may resemble the embedded fibers in FIG. 4. Some "cross" beams may be perpendicular to the "I" beams 602, and some "cross" beams may be parallel to the "I" beams 602.

The technique may deposit TiN on the exposed metal beams 602, 604 to promote Si-metal adhesion. The technique at 628 may deposit a 70-nm Si layer 606 on top of the $SiO_2$ layer 608 using a heteroepitaxial process or CVD process.

The membranes 302, 400 in FIGS. 3 and 5 may be organic membranes made by a modified version of a published procedure in "From Monolayers of a Tethered Polymer Melt to Freely Suspended Elastic Membranes" by Goedel, Werner, *Organic Thin Films: Structure and Applications*, ACS Symposium Series 695.

Figure 7:
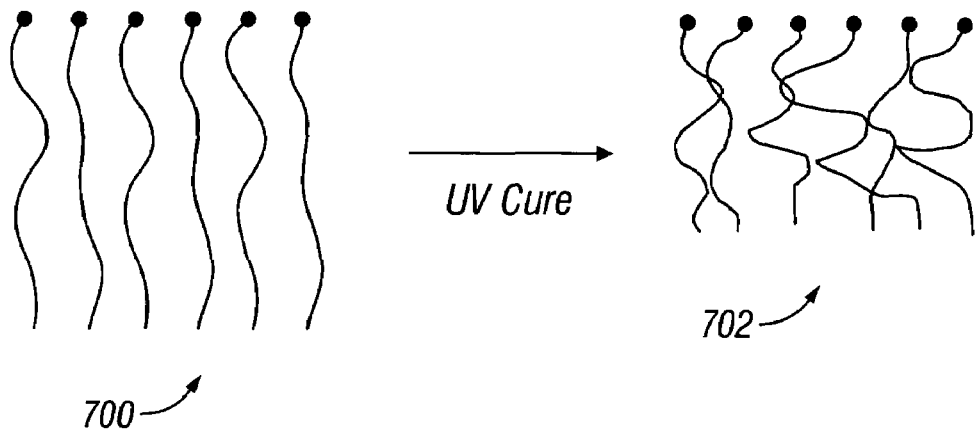
FIG. 7 illustrates a UV-cure part of a procedure for forming a polymer-chain membrane in FIGS. 4–5.
Figure 7A:
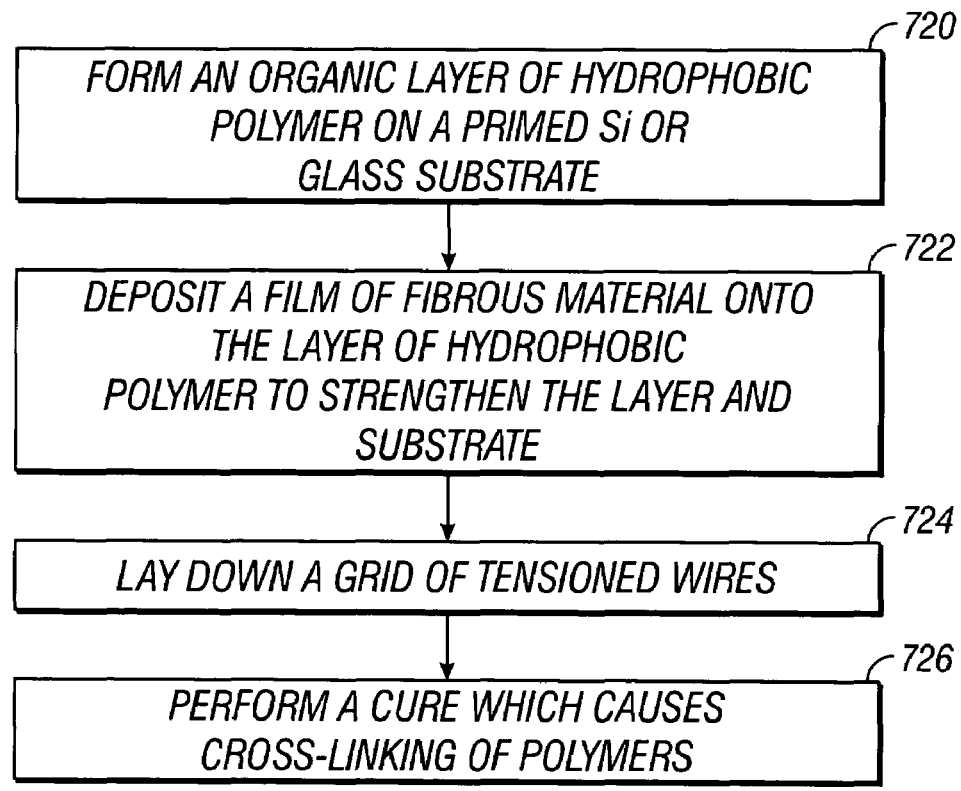
FIG. 7A illustrates a procedure for forming the membranes in FIGS. 3 and 5.

FIG. 7A illustrates a procedure of forming the membranes 302, 400 in FIGS. 3 and 5. At 720, an organic thin layer (e.g., monolayer) of hydrophobic polymer (e.g., polyisoprenes with ionic head groups) is formed on a primed Si or glass substrate. The polymer may be non-glassy. At 722, a film of fibrous material is deposited onto the thin layer of hydrophobic polymer to strengthen the thin layer and substrate. Several materials may be used as the fibrous material, such as dispersed Kevlar or carbon nanotube.

At 724, a mesh of tensioned wires 202 may be formed, as described above. At 726, an UV or non-UV cure (e.g., non-UV wavelengths, thermal, e-beam, etc.) may be per formed to a dose of at least 56 J/cm^2, which causes cross linking of polymers due to action of anthracene side groups. The result is an elastic membrane between wires which can be lifted off the substrate.

FIG. 7 illustrates a UV-cure part of the procedure described above for forming the polymer-chain membrane 400 in FIGS. 4–5. FIG. 7 illustrates polymers 700 before a UV cure and cross-linked polymers 702 after a UV cure.

A number of embodiments have been described. Nevertheless, it will be understood that various modifications may be made without departing from the spirit and scope of the application. Accordingly, other embodiments are within the scope of the following claims.

What is claimed is:

1. An apparatus comprising:
a membrane having a first side and a second side, the membrane being adapted to allow extreme ultraviolet radiation to pass from the first side to the second side, the membrane being adapted to prevent particles from passing from the first side to the second side, the membrane being less than 200 nanometers in thickness; and
a mesh of wires supporting the first side of the membrane.

2. The apparatus of claim 1, further comprising an extreme ultraviolet radiation source, wherein the membrane allows extreme ultraviolet radiation to pass from the first side to the second side of the membrane.

3. The apparatus of claim 1, wherein the wires have diameters of about 25 microns.

4. The apparatus of claim 1, wherein the wires are spaced about 1 millimeter apart from each other.

5. The apparatus of claim 1, wherein the mesh of wires and membrane are elastic.

6. The apparatus of claim 5, further comprising a gas source operable to produce a gas that exerts pressure on the second side of the membrane and holds the membrane up against the mesh of wires.

7. The apparatus of claim 6, wherein the gas source produces a repulsive jet through any pinholes in the membrane and prevents particles on the first side from entering the pinholes.

8. The apparatus of claim 6, wherein the gas source removes particles from the second side of the membrane.

9. The apparatus of claim 1, further comprising:
a reticle on the second side of the membrane;
a frame supporting edges of the membrane and the mesh of wires a pre-determined distance above the reticle.

10. The apparatus of claim 9, wherein the frame supports edges of the membrane and the mesh of wires about one to ten centimeters above the reticle.

11. The apparatus of claim 9, wherein the frame includes laser-drilled holes through which the wires are threaded.

12. The apparatus of claim 9, wherein ends of the wires are bonded to the frame.

13. The apparatus of claim 9, wherein the frame includes a spring-loaded tension apparatus to hold the mesh of wires.

14. The apparatus of claim 1, wherein the membrane comprises embedded fibers.

15. The apparatus of claim 1, wherein the membrane comprises embedded support beams.

16. The apparatus of claim 1, wherein the membrane comprises a silicon layer.

17. The apparatus of claim 1, wherein the membrane comprises a silicon layer, a silicon dioxide layer, and a plurality of support beams.

18. The apparatus of claim 1, wherein the membrane comprises a substantially elastic, cured polymer-chain layer.

19. The apparatus of claim 1, wherein the membrane comprises an organic layer of hydrophobic polymer on a substrate.

20. The apparatus of claim 19, wherein the membrane further comprises a fibrous material layer.

* * * * *